United States Patent
Yeh

(10) Patent No.: US 8,088,662 B2
(45) Date of Patent: Jan. 3, 2012

(54) FABRICATION METHOD OF TRENCHED METAL-OXIDE-SEMICONDUCTOR DEVICE

(75) Inventor: Chun Ying Yeh, Hsinchu (TW)

(73) Assignee: Niko Semiconductor Co., Ltd., Taipei (TW)

( * ) Notice: Subject to any disclaimer, the term of this patent is extended or adjusted under 35 U.S.C. 154(b) by 0 days.

(21) Appl. No.: 13/149,812

(22) Filed: May 31, 2011

(65) Prior Publication Data
US 2011/0230025 A1    Sep. 22, 2011

Related U.S. Application Data

(62) Division of application No. 12/544,164, filed on Aug. 19, 2009, now Pat. No. 7,977,192.

(30) Foreign Application Priority Data
Dec. 12, 2008    (TW) ................................ 97148359 A

(51) Int. Cl.
H01L 21/336    (2006.01)

(52) U.S. Cl. ..... 438/270; 438/294; 438/299; 257/E21.41
(58) Field of Classification Search .................. 438/270, 438/299, 294; 257/E21.41
See application file for complete search history.

(56) References Cited

U.S. PATENT DOCUMENTS

| | | | |
|---|---|---|---|
| 6,489,652 B1 * | 12/2002 | Jeon et al. ...................... 257/330 |
| 2007/0190728 A1 * | 8/2007 | Sreekantham et al. ....... 438/270 |
| 2010/0244126 A1 * | 9/2010 | Purtell et al. .................. 257/330 |

* cited by examiner

*Primary Examiner* — Alexander Ghyka
*Assistant Examiner* — Seahvosh Nikmanesh
(74) *Attorney, Agent, or Firm* — Pai Patent & Trademark Law Firm; Chao-Chang David Pai

(57) ABSTRACT

A fabrication method of a trenched metal-oxide-semiconductor device is provided. Firstly, an epitaxial layer is formed on a substrate. Then, a plurality of gate trenches is formed in the epitaxial layer. Afterward, a spacer is formed on the sidewall of the trench gates. The spacer is utilized as a mask to selectively implant oxygen ion into the bottom of the gate trenches so as to form a bottom oxide layer on the bottom of the gate trenches to reduce capacitance between gate and drain.

9 Claims, 12 Drawing Sheets

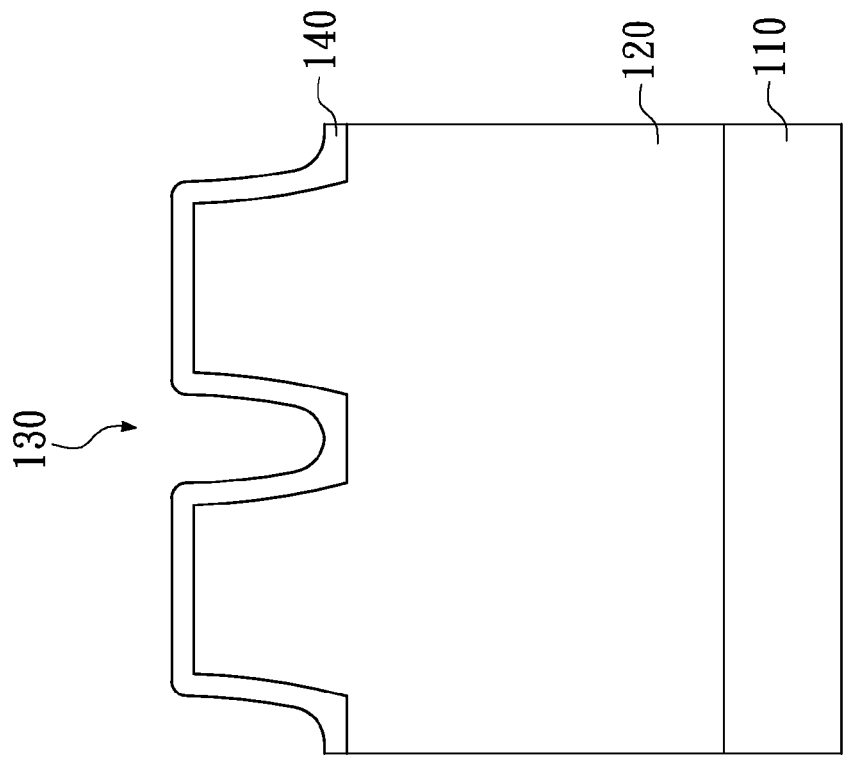
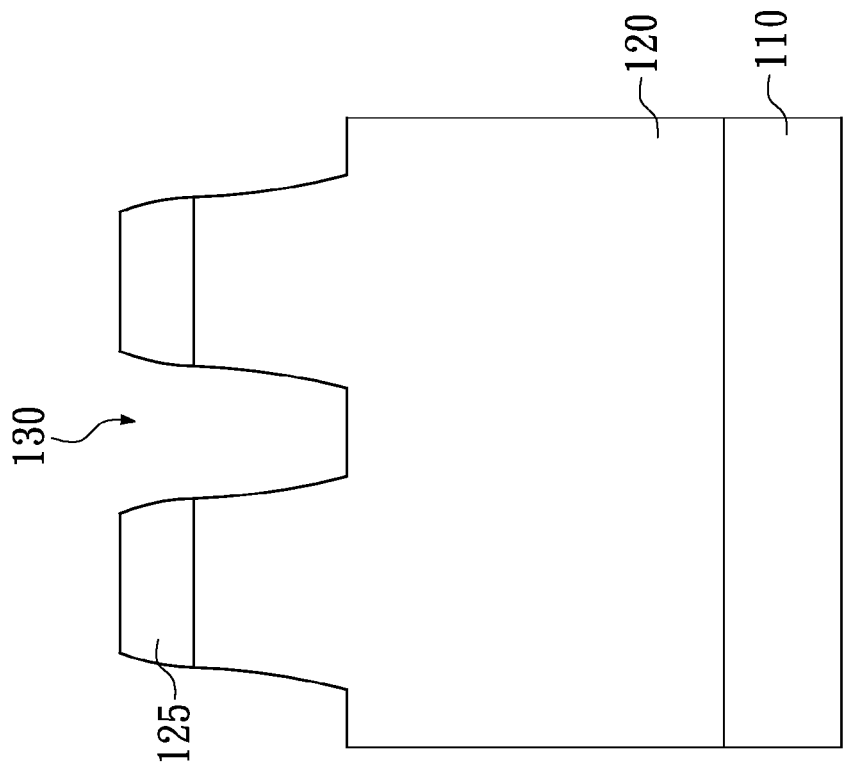
FIG. 1A
FIG. 1B

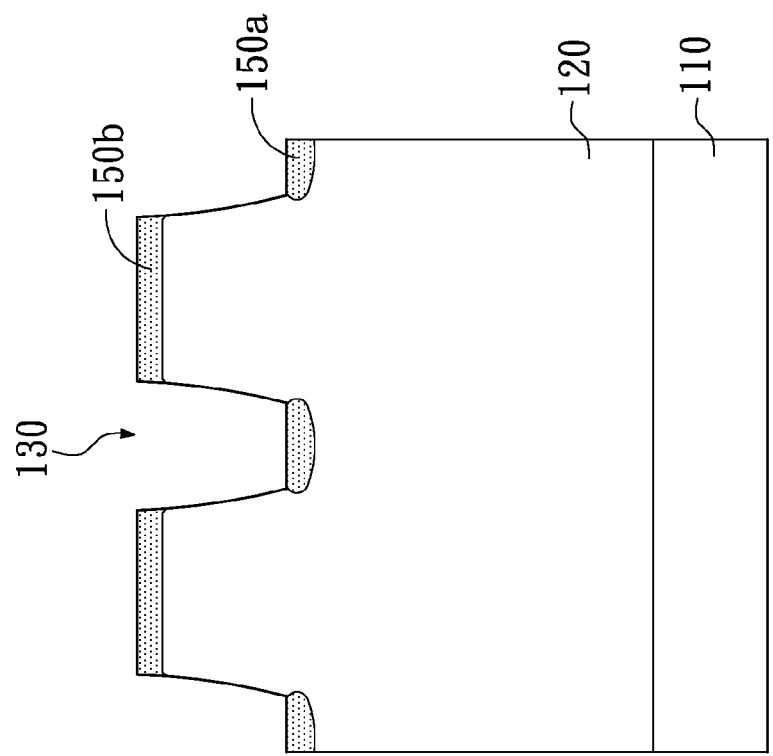
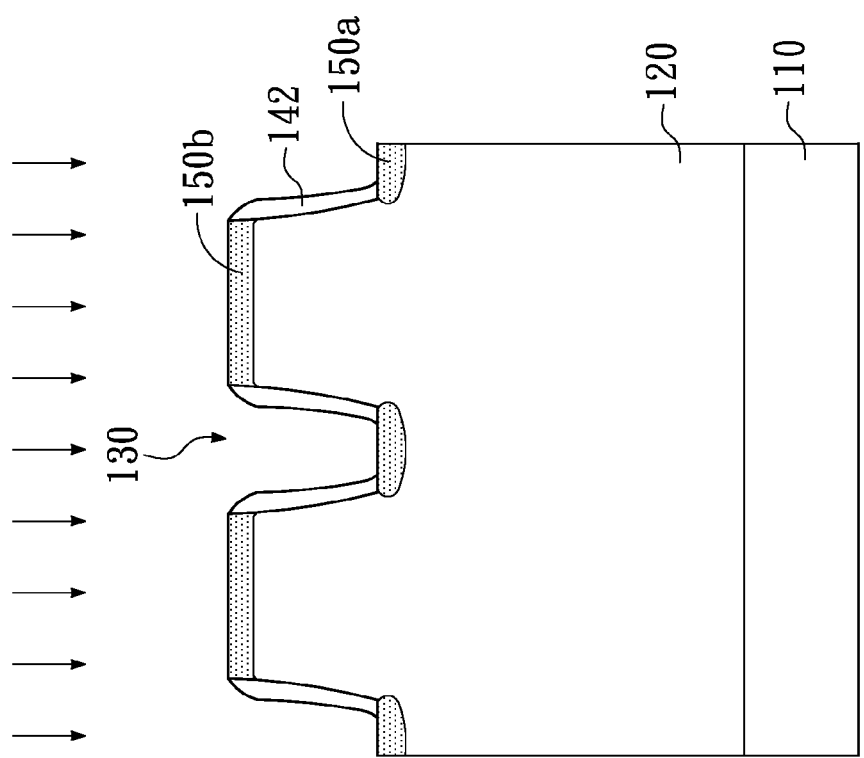

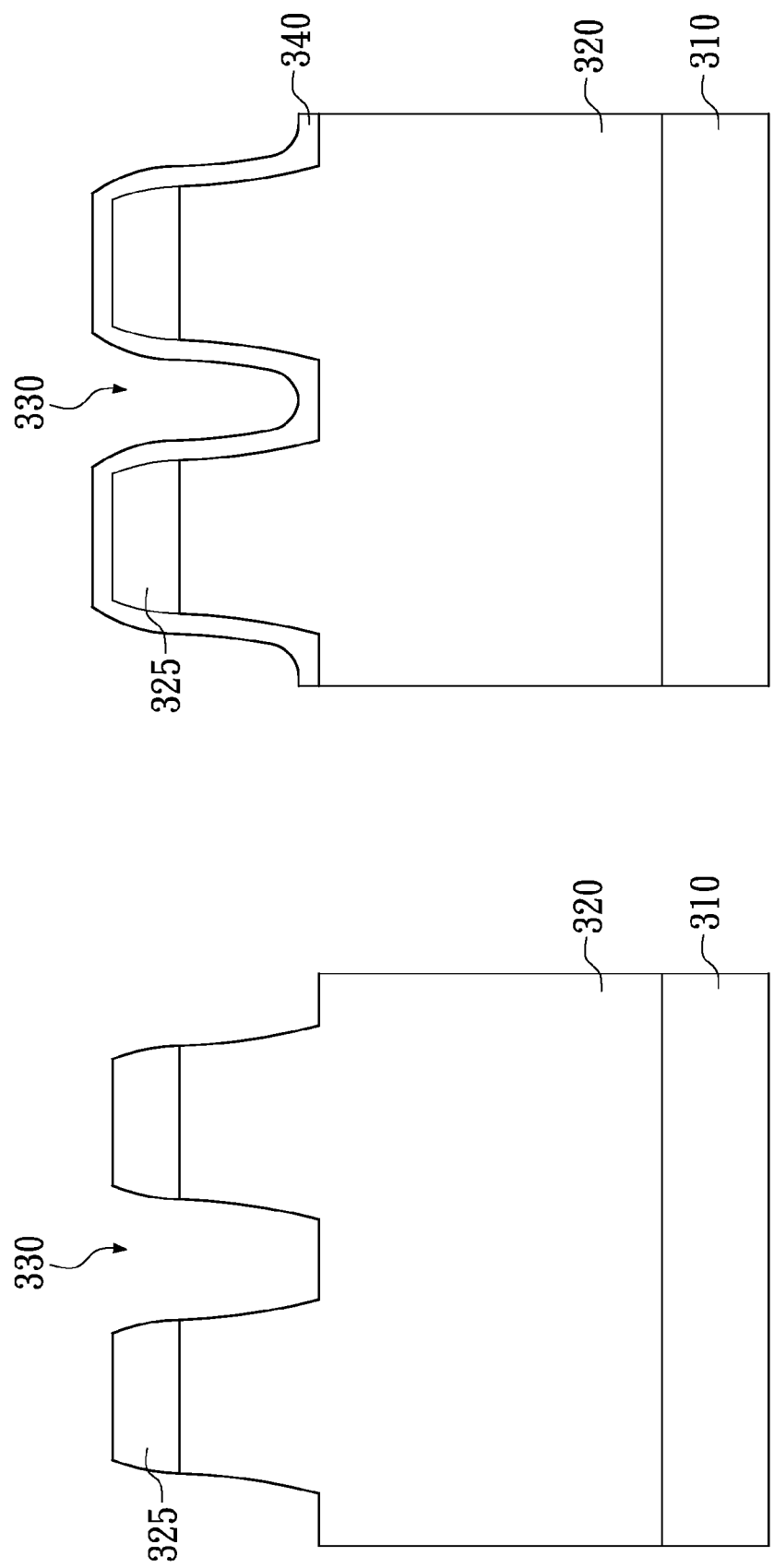

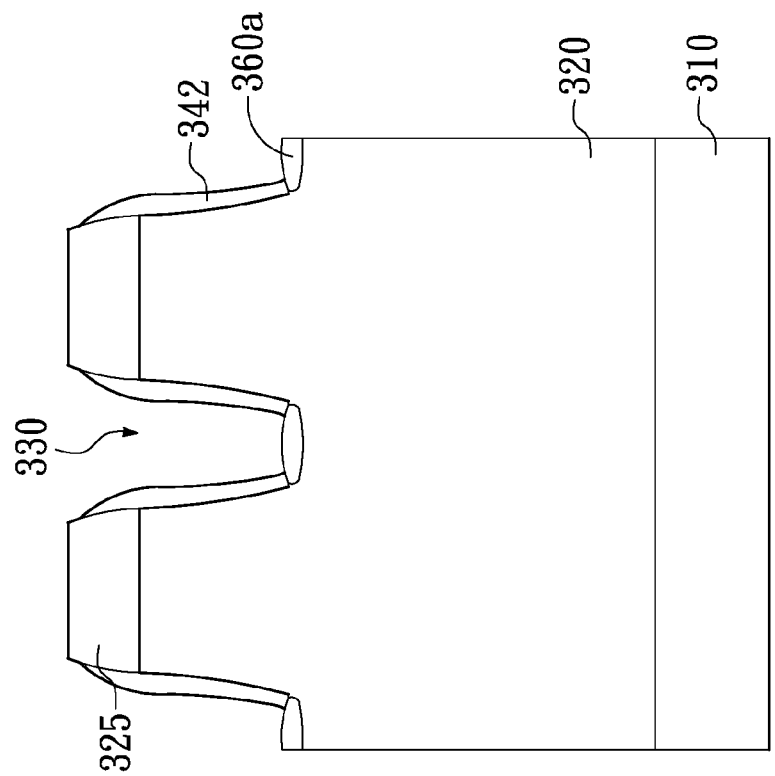
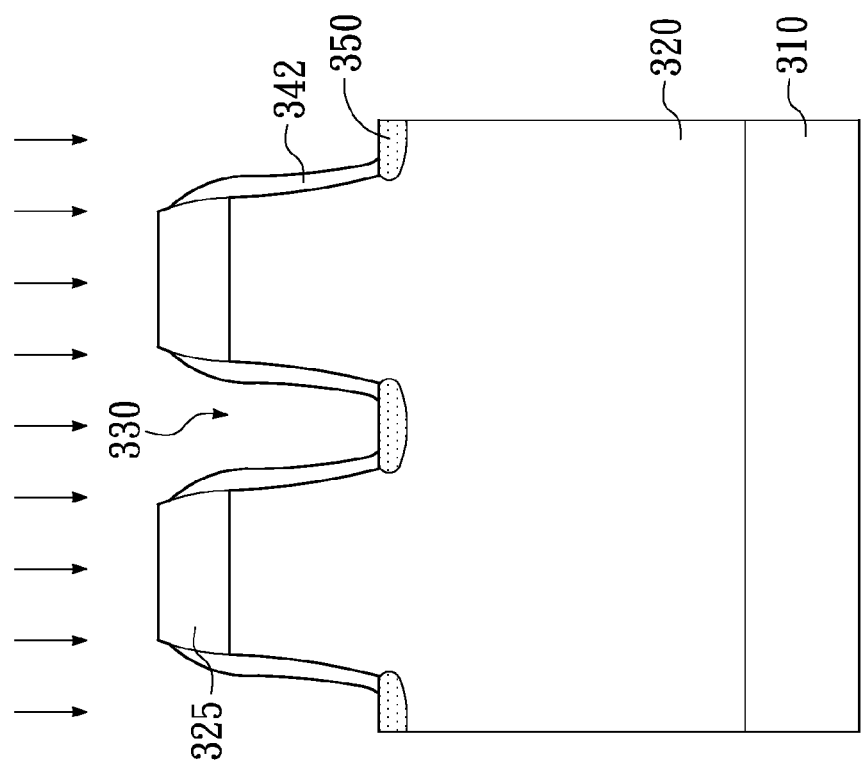
FIG. 3D
FIG. 3C

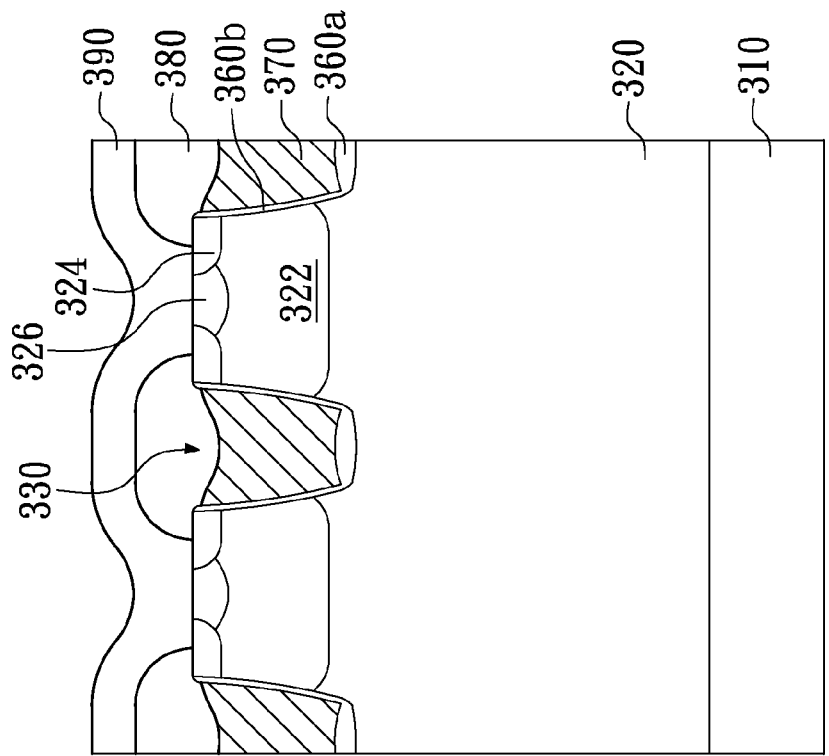
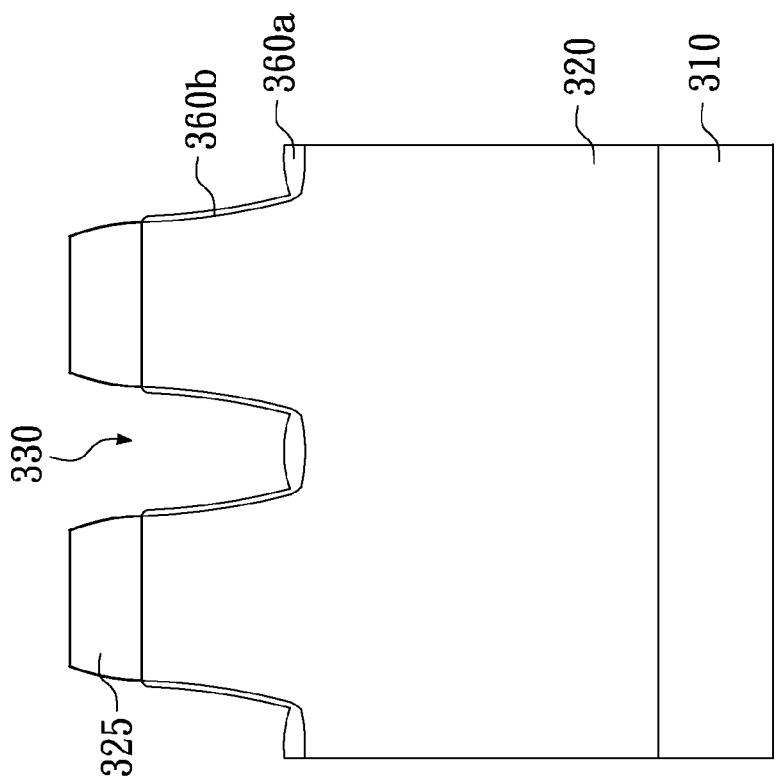
FIG. 3F
FIG. 3E

FABRICATION METHOD OF TRENCHED METAL-OXIDE-SEMICONDUCTOR DEVICE

CROSS REFERENCE TO RELATED APPLICATIONS

The present application is a division of prior U.S. application Ser. No. 12/544,164 filed Aug. 19, 2009, entitled "FABRICATION METHOD OF TRENCHED METAL-OXIDE-SEMICONDUCTOR DEVICE". The prior U.S. Application claims priority of Taiwan Patent Application No. 097148359, filed on Dec. 12, 2008, the entirety of which is incorporated herein by reference.

BACKGROUND OF THE INVENTION

1. Field of the Invention

This invention relates to a fabrication method of a trenched metal-oxide-semiconductor (MOS) device, and more particularly relates to a fabrication method of a trenched MOS device with low gate-to-drain charge (Qgd).

2. Description of Related Art

In contrast with typical planar metal-oxide-semiconductor (MOS) devices with current flow substantially parallel to the surface of the semiconductor base, trenched MOS devices with gate electrodes thereof allocated in the trenches for generating perpendicular current flow have the potential to reduce cell size and material cost. Among all the MOS devices in the market, metal-oxide-semiconductor field effect transistors (MOSFETs) and insulated gate bipolar transistors (IGBTs) are two common MOS devices for power applications.

The energy losses in a MOS device include conduction loss due to conduction resistance and switching loss due to gate-to-drain charge (Qgd). With the increasing of operating frequency, switching loss becomes a dominant factor for the problem of energy loss. It is understood that switching loss can be reduced by lowering gate-to-drain capacitance (Cgd) of the MOS devices. However, typical fabrication methods for lowering gate-to-drain capacitance of the MOS devices are quite complicated and costly.

Accordingly, it is an important issue in the field to find out a simple method to fabricate a trenched MOS device with low gate-to-drain capacitance.

SUMMARY OF THE INVENTION

It is an object of the present invention to provide a simple fabrication method of a trenched metal-oxide-semiconductor (MOS) device with low gate-to-drain capacitance for reducing switching loss.

In a first aspect of the present invention, a fabrication method of a trenched MOS device is provided. The fabrication method comprises the steps of: (a) providing a semiconductor base; (b) forming a plurality of gate trenches in the semiconductor base; (c) forming a plurality of spacers on the sidewalls of the gate trenches respectively; (d) implanting oxygen ions into the bottoms of the gate trenches by using the spacers as a mask; (e) forming a bottom oxide layer at the bottoms of the gate trenches by thermal oxidation; (f) forming a gate oxide layer lining the sidewalls of the gate trenches; and (g) forming a plurality of polysilicon gates in the gate trenches respectively.

In another aspect of the present invention, another fabrication method of a trenched MOS device is provided. The fabrication method comprises the steps of: (a) providing a semiconductor base; (b) forming a plurality of gate trenches in the semiconductor base; (c) forming a sacrifice oxide layer over the exposed surfaces of the semiconductor base; (d) selectively implanting oxygen ions into the bottoms of the gate trenches through the sacrifice oxide layer; (e) removing the sacrifice oxide layer; (f) forming a bottom oxide layer at the bottoms of the gate trenches; (g) forming a gate oxide layer lining the sidewalls of the gate trenches; and (h) forming a plurality of polysilicon gates in the gate trenches respectively.

In the present invention, oxygen ions are selectively implanted to the bottoms of the gate trenches through the spacers or the sacrifice oxide layer so as to adjust the thickness at the bottoms of the gate trenches. Therefore, the object of reducing gate-to-drain capacitance can be achieved. In addition, the spacers formed on the sidewalls of the gate trenches does not need an additional lithographic step, and the gate oxide layer and the bottom oxide layer with different thickness can be formed by using one thermal oxidation step. Thus, the fabrication cost can be effectively reduced.

BRIEF DESCRIPTION OF THE DRAWINGS

The present invention will now be specified with reference to its preferred embodiment illustrated in the drawings, in which:

FIGS. 1A to 1F are schematic views showing a first embodiment of the fabrication method of the trenched MOS device in accordance with the present invention;

FIGS. 3A to 3F are schematic views showing a third embodiment of the fabrication method of the trenched MOS device in accordance with the present invention.

DETAILED DESCRIPTION OF THE PREFERRED EMBODIMENTS

Figure 1F:
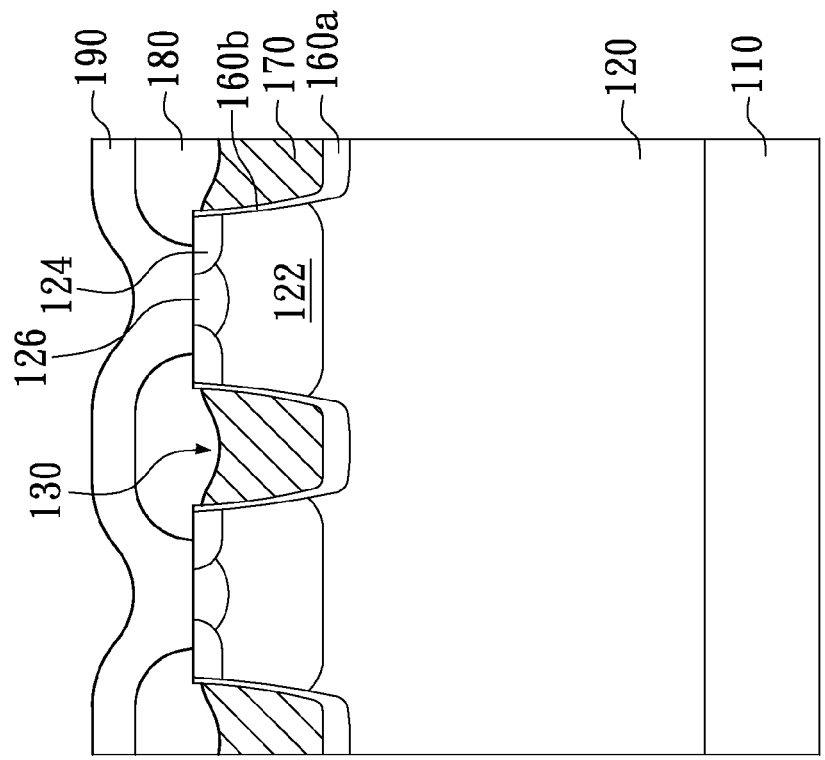
Figure 1E:
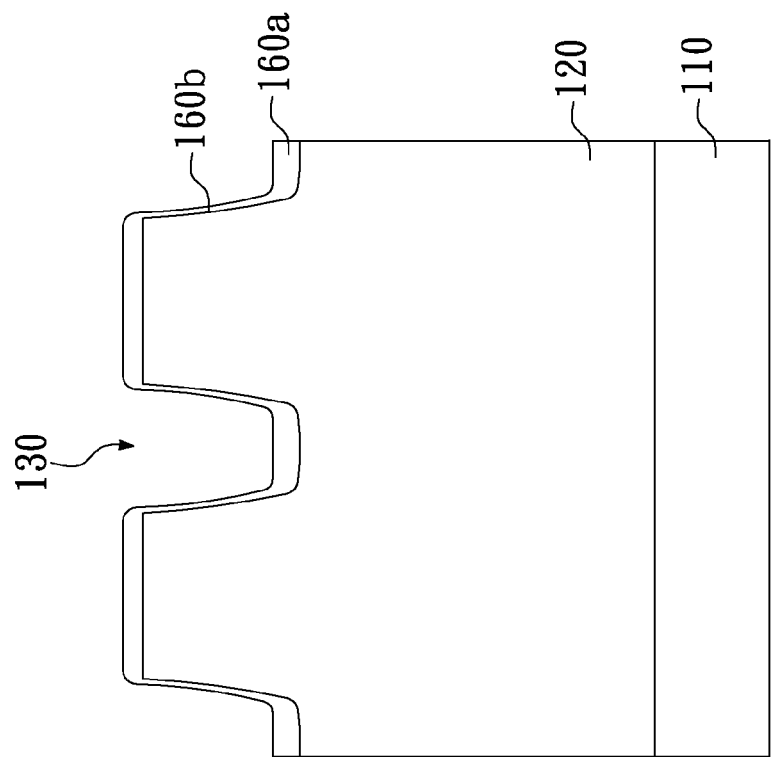

FIGS. 1A to 1F are schematic views showing a first embodiment of the fabrication method of the trenched MOS device in accordance of the present invention. As shown in FIG. 1A, firstly, a substrate 110 is provided and an epitaxial layer 120 is formed on the substrate 110. The substrate 110 and the epitaxial layer 120 compose a semiconductor base for forming the trenched MOS device. Then, a pattern layer 125 is formed on the epitaxial layer 120 to define the location of trenched gates by using lithography and etching technology. The pattern layer 125 may be formed of silicon oxide or silicon nitride according to the need. Afterward, the epitaxial layer 120 is etched through the pattern layer 125 to form a plurality of gate trenches 130 in the epitaxial layer 120.

Thereafter, referring to FIG. 1B, the pattern layer 125 on the epitaxial layer 120 is removed. Then, a passivation layer 140 is deposited along the surface profile of the epitaxial layer 120. As shown, the passivation layer 140 covers the upper surface of the epitaxial layer 120 and lines the sidewalls and the bottoms of the gate trenches 130. The passivation layer 140 may be formed of silicon oxide or silicon nitride.

Thereafter, referring to FIG. 1C, an anisotropic etching step is carried out with an etching direction along the normal of the substrate 110. In the anisotropic etching step, the portions of the passivation layer 140 at the bottoms of the gate trenches 130 and over the upper surface of the epitaxial layer 120 are removed to leave the portions lining the sidewalls of the gate trenches 140 as the spacers 142. Then, the spacers 142 are utilized as a mask for selectively implanting oxygen ions (with implanting direction shown by the arrow) into the bottoms 150a of the gate trenches 130 and the upper surface region 150b of the epitaxial layer 120. In order to make sure that the bottoms 150a of the gate trenches 130 are exposed after the anisotropic etching step, the thickness of the passivation layer 140 should be carefully controlled. As a preferred embodiment, the thickness of the passivation layer 140 had better be smaller than ⅓ the width of the gate trench 130.

Afterward, referring to FIG. 1D, the spacers 142 is removed. Then, referring to FIG. 1E, a thermal oxidation step is carried out to grow oxide layers on the exposed surfaces of the epitaxial layer 120. It is noted that growing rate of oxide layer during thermal oxidation step is relative to the supply of oxygen. Because the oxygen ions are pre-implanted to the bottoms 150a of the gate trenches 130, growing rate of the oxide layer at the bottom 150a is faster. Therefore, as an ordinary gate oxide layer 160b is formed on the sidewalls of the gate trenches 130 in the thermal oxidation step, a thicker bottom oxide layer 160a would be formed at the bottoms 150a of the gate trenches 130 simultaneously. The thickness and shape of the bottom oxide layer 160a is relative to the concentration of implanted oxygen ions and the implant depth of the oxygen ions. In the present embodiment, the implanted oxygen ions should be restricted to the surface portion of the bottoms 150a of the gate trenches 130 to make sure that the silicon oxide grown from the exposed surface and the silicon oxide grown by the implanted oxygen ions embedded in the epitaxial layer 120 are integrated to form the bottom oxide layer 160a.

Afterward, referring to FIG. 1F, a plurality of polysilicon gates 170 are formed in the gate trenches 130 respectively. Thereafter, a body 122 with a first conductive type is formed in the epitaxial layer 120 by ion implantation and then a plurality of source regions 124 with a second conductive type are formed in the body 122 by ion implantation. The first conductive type and the second conductive type may be N-type and P-type respectively for fabricating N-type MOS devices, or P-type and N-type respectively for fabricating P-type MOS devices. Then, a dielectric layer 180 is formed over the epitaxial layer 120 to cover the polysilicon gates 170. Afterward, a heavily doped region 126 with the first conductive type is formed between two neighboring source regions 124. Finally, a metal layer 190 is formed over the epitaxial layer 120 to connect the source regions 124.

In the present embodiment, the substrate 110 and the epitaxial layer 120 composes a semiconductor base, and the following fabrication steps are carried out to form the trenched MOS device on the semiconductor base. In addition, referring to FIG. 1F, the body 122 of the trenched MOS device is formed in the epitaxial layer 120 after completing the formation of the polysilicon gates 170. However, the scope of the present invention is not so restricted. In another aspect of the present invention, the body of the trenched MOS device may be defined previous to the formation of the gate trenches. In detail, an epitaxial layer and a body layer may be grown on the substrate 110 in a serial to form a three-tier semiconductor base before the formation of gate trenches. The body layer composing the body of the trenched MOS device is of the first conductive type and the epitaxial layer is of the second conductive type. The gate trenches, which define the gate of the trenched MOS device, are formed in the body layer and penetrate the body layer to the underneath epitaxial layer.

FIGS. 2A to 2F are schematic views showing a second embodiment of the fabrication method of the trenched MOS device in accordance with the present invention. In contrast with the first embodiment of the present invention, which removes the pattern layer 125 before depositing the passivation layer 140 on the epitaxial layer 120, the present embodiment has the pattern layer 225 remained on the epitaxial layer 220 when depositing the passivation layer 240 over the epitaxial layer 220. That is, the passivation layer 240 is deposited along the surface profiles composed of the epitaxial layer 220 and the pattern layer 225. The passivation layer 240 covers the pattern layer 225 and lines the bottoms and the sidewalls of the gate trenches 230.

Figure 2B:
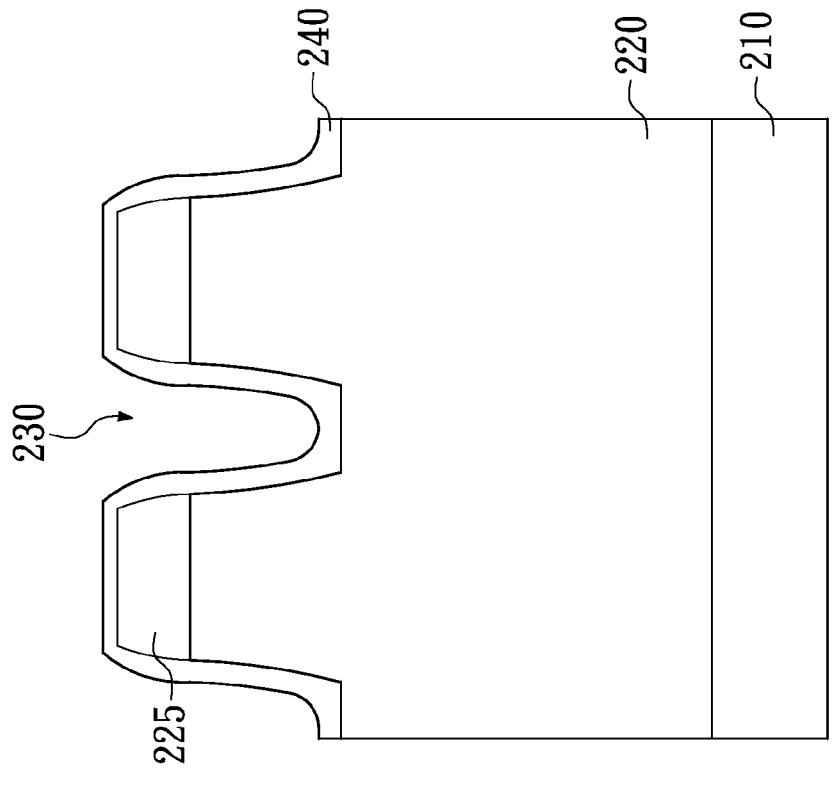
FIGS. 2A to 2F are schematic views showing a second embodiment of the fabrication method of the trenched MOS device in accordance with the present invention.
Figure 2A:
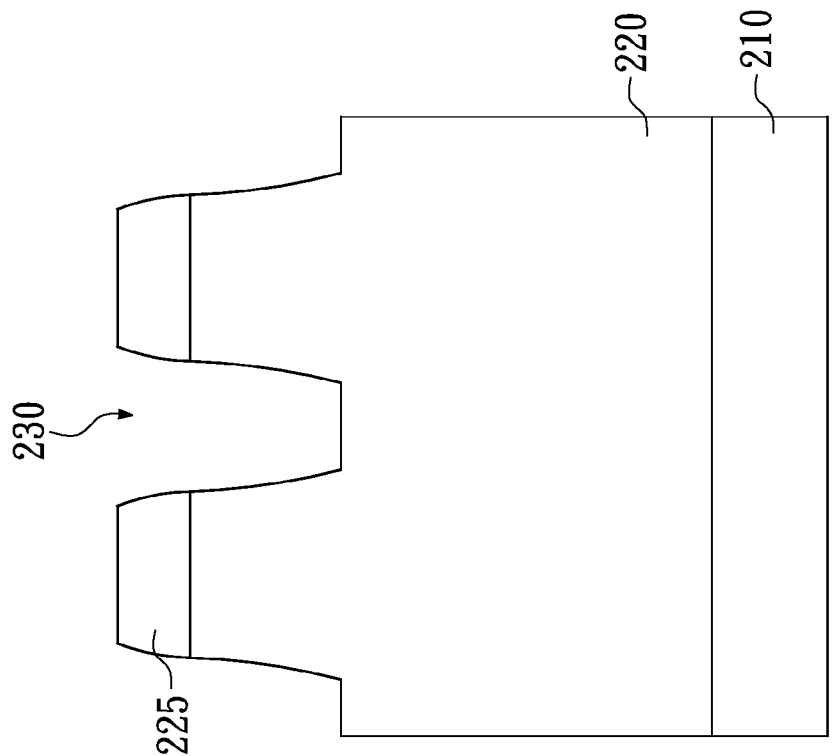
Figure 2D:
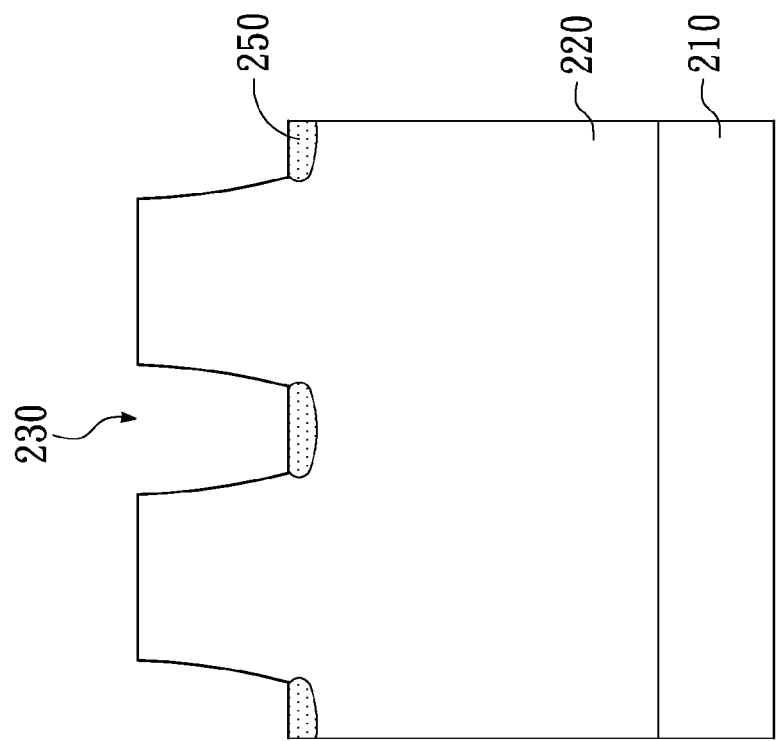
Figure 2C:
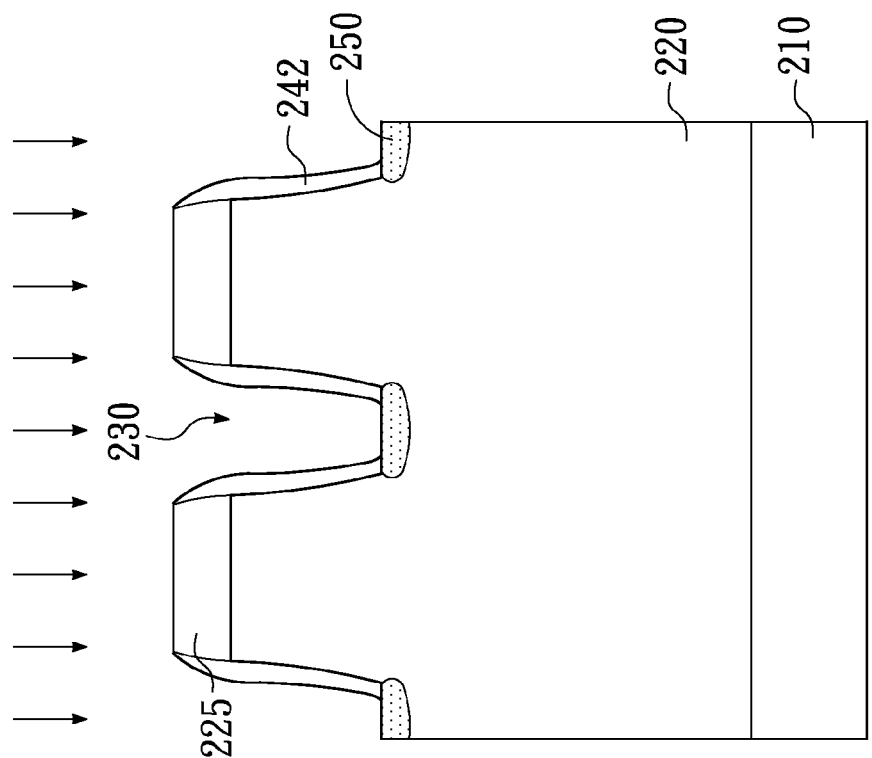

Afterward, referring to FIG. 2C, an anisotropic etching step is carried out with an etching direction along the normal of the substrate 210. In the anisotropic etching step, the portions the passivation layer 240 at the bottoms of the gate trenches 230 are removed to leave the portions on the sidewalls of the gate trenches 230 as the spacers 242. Then, the spacers 242 are utilized as a mask for selectively implanting oxygen ions (with implanting direction shown by the arrows) into the bottoms 250 of the gate trenches 230. It is noted that after the anisotropic etching step, the epitaxial layer 220 is still covered by the pattern layer 225 and thus only the bottoms 250 of the gate trenches 230 are implanted with oxygen ions.

Afterward, referring to FIG. 2D, the spacers 242 and the pattern layer 225 are removed. Then, referring to FIG. 2E, a thermal oxidation step is carried out to grow oxide layers over the exposed surfaces of the epitaxial layer 220. Growing rate of oxide layer at the bottoms 250 of the gate trenches 230 is faster because of the pre-implanted oxygen ions at the bottoms 250 of the gate trenches 230. Thus, thickness of the oxide layers 260a, 260b grown at the bottoms and on the sidewalls of the gate trenches 230 are different. In detail, as an ordinary gate oxide layers 260b is formed on the sidewalls of the gate trenches 230 in the present thermal oxidation step, a thicker bottom oxide layer 260a would be formed at the bottoms of the gate trenches 230 simultaneously to reduce gate-to-drain capacitance (Cgd) of the trenched MOS device.

Figure 2F:
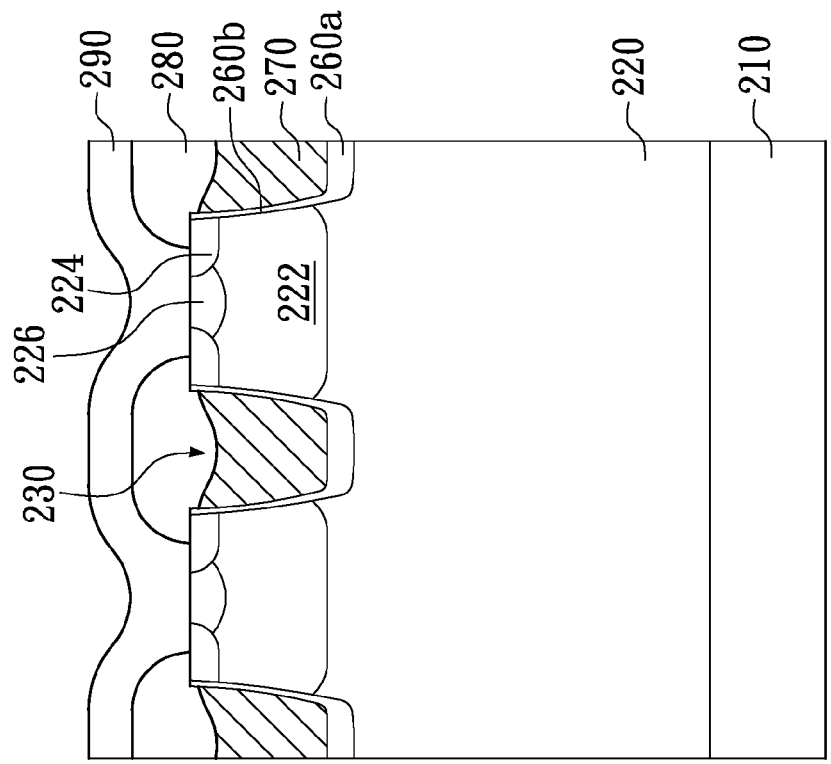
Figure 2E:
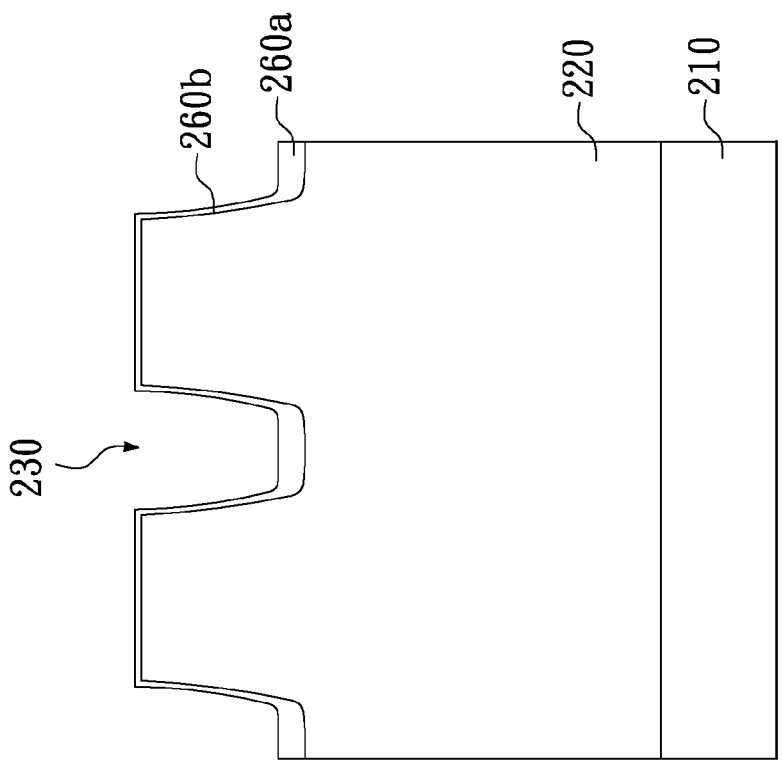

Afterward, referring to FIG. 2F, a plurality of polysilicon gates 270 are formed in the gate trenches 230 respectively. Thereafter, a body 222 with a first conductive type is formed in the epitaxial layer 220 by ion implantation and then a plurality of source regions 224 with a second conductive type are formed in the body 222. Then, a dielectric layer 280 is formed over the epitaxial layer 220 to cover the polysilicon gates 270. Afterward, a heavily doped region 226 with the first conductive type is formed between two neighboring source regions 224. Finally, a metal layer 290 is formed over the epitaxial layer 220 to connect the source regions 224.

FIGS. 3A to 3F are schematic views of a third embodiment of the fabrication method of the trenched MOS device in accordance with the present invention. In contrast with the first and the second embodiments of the present invention, in which the spacers 142,242 and the pattern layer 250 are removed before applying thermal oxidation, the spacers 342 in the present embodiment are remained on the sidewalls of the gate trenches 330 during the thermal oxidation step. Therefore, only the bottom oxide layer 360a at the bottoms 350 of the gate trenches 330 is formed during the thermal oxidation step.

Afterward, referring to FIG. 3E, the spacers 342 are removed to expose the sidewalls of the gate trenches 330. Then, another thermal oxidation step is carried out to form a gate oxide layer 360b on the sidewalls of the gate trenches 330. In the first and second embodiments of the present invention, the bottom oxide layer 160a,260a and the gate oxide layer 160b,260b are formed simultaneously. In contrast, the present embodiment adopts two thermal oxidation steps to grow the bottom oxide layer 360a at the bottoms 350 and the gate oxide layer 360b on the sidewalls of the gate trenches 330 respectively. The fabrication method of the present embodiment is more complicated, but the fabrication flexibility is enhanced because oxidation parameters of the two thermal oxidation steps can be independently adjusted to vary the thickness of the bottom oxide layer 360a and the gate oxide layer 360b according to the demand for the design.

Afterward, referring to FIG. 3F, the pattern layer 325 on the epitaxial layer 320 is removed. Then, a plurality of polysilicon gates 370 are formed in the gate trenches 330 respectively. Thereafter, a body 322 with a first conductive type is formed in the epitaxial layer 320 and then a plurality of source regions 324 with a second conductive type are formed in the body 322. Then, a dielectric layer 380 is formed over the epitaxial layer 320 to cover the polysilicon gates 370. Afterward, a heavily doped region 326 with the first conductive type is formed between two neighboring source regions 324. Finally, a metal layer 390 is formed over the epitaxial layer 320 to connect the source regions 324.

FIGS. 4A to 4E are schematic views showing a fourth embodiment of the fabrication method of the trenched MOS device in accordance with the present invention. In contrast with the first to the third embodiments of the present invention, in which the spacers 142,242,342 are used as a mask to prevent oxygen ions from being implanted to the sidewalls of the gate trenches 130,230,330, referring to FIGS. 4A and 4B, the present embodiment adopts the sacrifice oxide layer 440 for selectively implanting oxygen ions to the bottoms 450 of the gate trenches 430. For a better understanding of the present embodiment, referring to FIG. 4B, an angle between the implanting direction (as shown by the arrow) of the present oxygen ion implanting step and the sidewalls of the gate trenches 430 is much smaller than 90 degrees, thus, it is much harder for oxygen ions to penetrate the sacrifice oxide layer 440 on the sidewalls of the gate trenches 430 to reach the underneath epitaxial layer 420 even though the sacrifice oxide layer 440 has substantially the same thickness on the bottoms and the sidewalls of the gate trenches 430. Therefore, the sacrifice oxide layer 440 on the epitaxial layer 420 can be used for selectively implanting oxygen ions to the bottoms 450 of the gate trenches 430 as implantation energy is properly controlled.

Figure 4B:
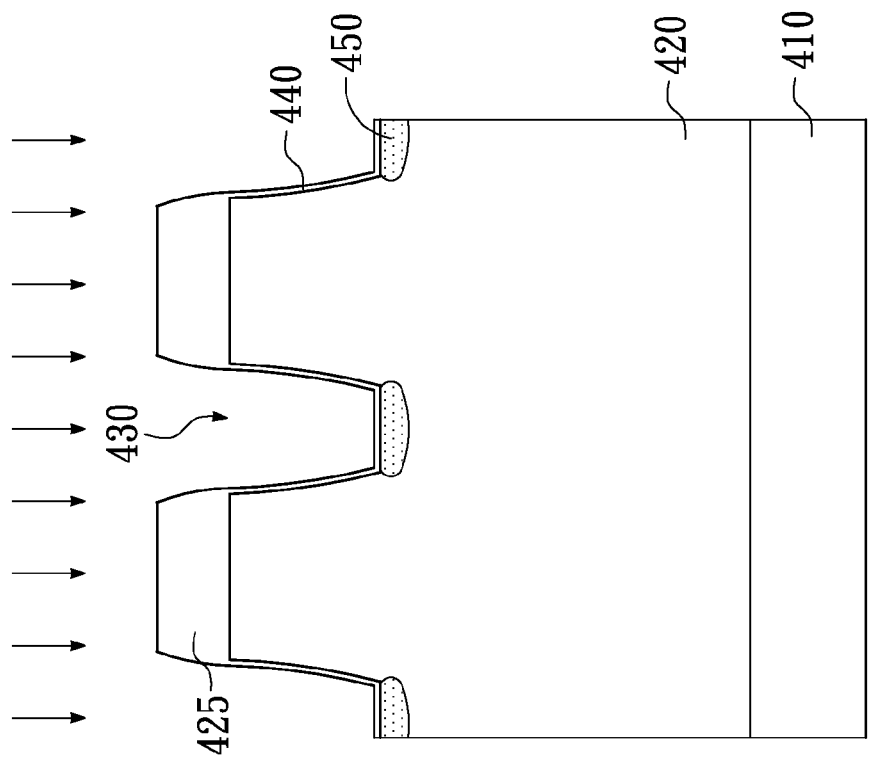
FIGS. 4A to 4E are schematic views showing a fourth embodiment of the fabrication method of the trenched MOS device in accordance with the present invention.
Figure 4A:
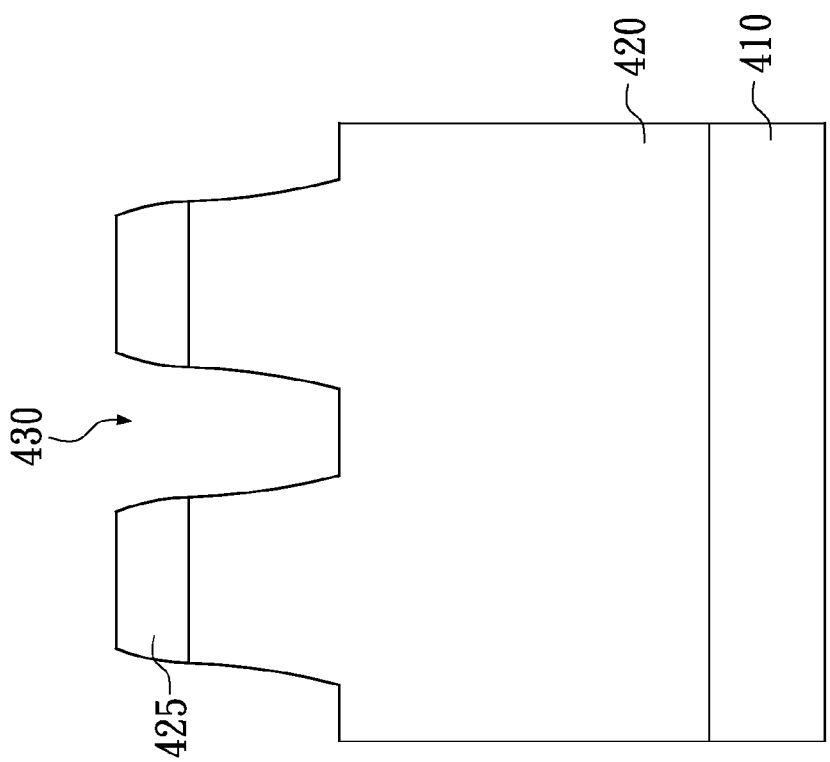
Figure 4D:
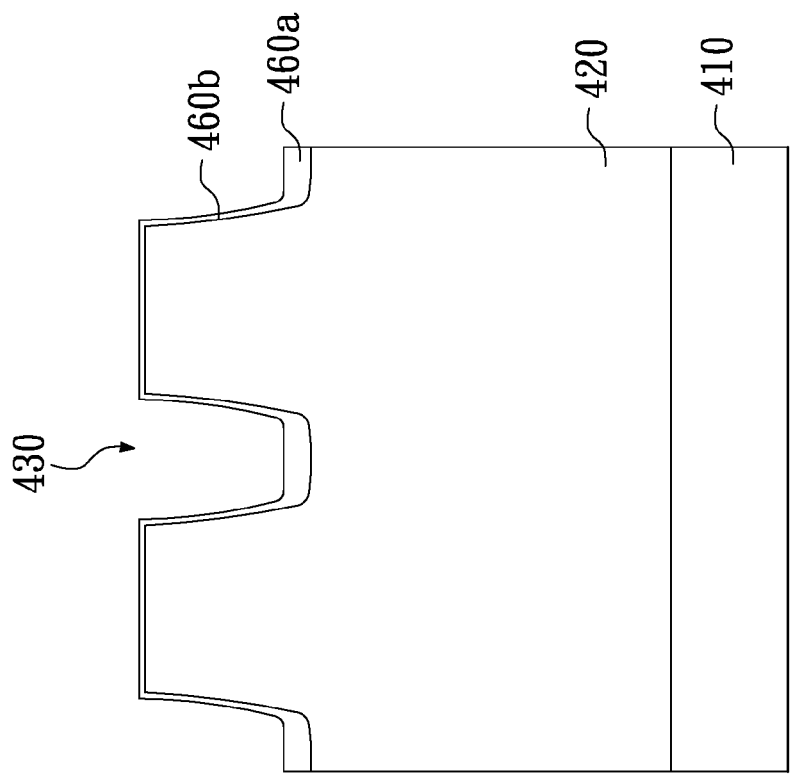
Figure 4C:
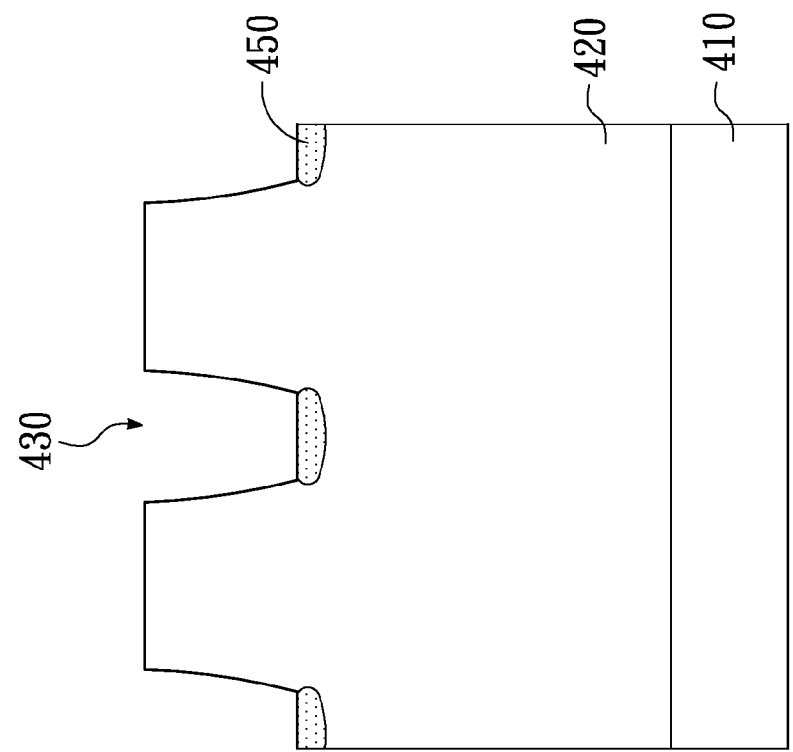

Afterward, referring to FIG. 4C, the sacrifice oxide layer 440 and the pattern layer 425 are removed. Then, referring to FIG. 4D, a thermal oxidation step is carried out to grow oxide layers 460a,460b over the exposed surfaces of the epitaxial layer 420. Growing rate of the oxide layer at the bottoms 450 of the gate trenches 430 is faster than that on the sidewalls because of the pre-implanted oxygen ions. Thus, as an ordinary gate oxide layer 460b is formed on the sidewalls of the gate trenches 430, a thicker bottom oxide layer 460a would be formed at the bottoms of the gate trenches 430 for reducing gate-to-drain capacitance (Cgd) of the trenched MOS device in the same thermal oxidation step.

Figure 4E:
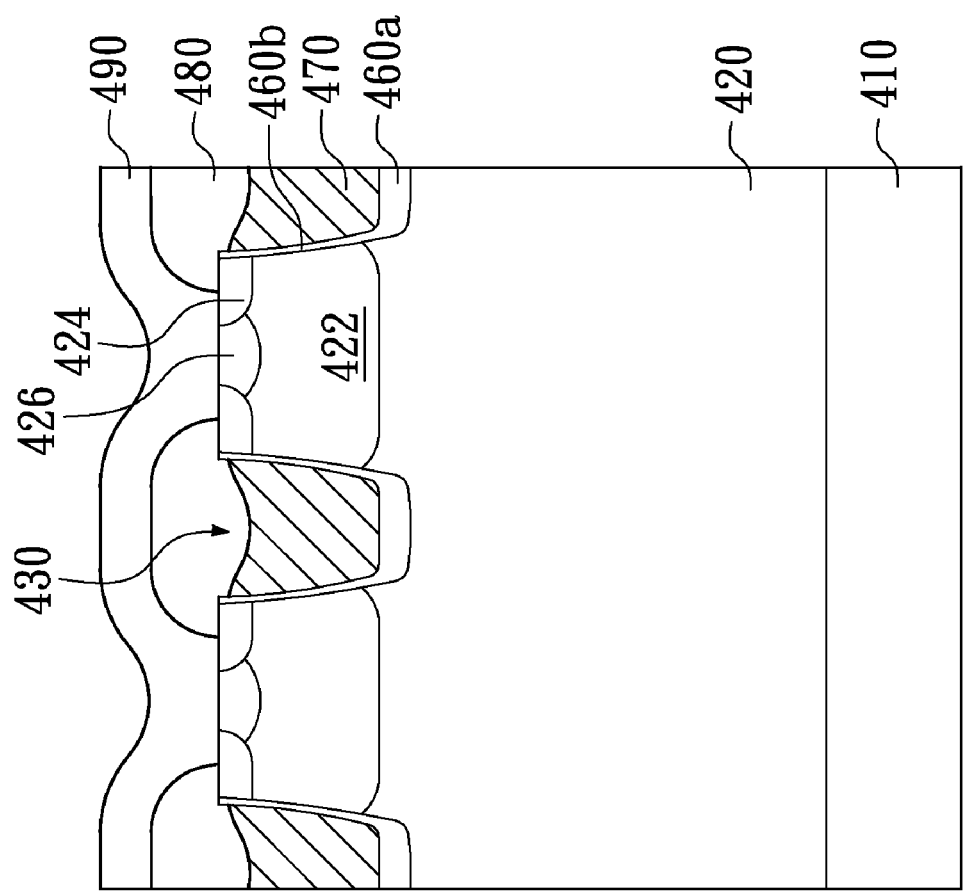

Afterward, referring to FIG. 4E, a plurality of polysilicon gates 470 are formed in the gate trenches 430 respectively. Thereafter, a body 422 with a first conductive type is formed in the epitaxial layer 420 and then a plurality of source regions 424 with a second conductive type are formed in the body 422. Then, a dielectric layer 480 is formed over the epitaxial layer 420 to cover the polysilicon gates 470. Afterward, a heavily doped region 426 with the first conductive type is formed between two neighboring source regions 424. Finally, a metal layer 490 is formed over the epitaxial layer 420 to connect the source regions 424.

Referring to FIGS. 4B and 4C, the sacrifice oxide layer 440 is formed over the sidewalls and bottoms of the gate trenches 430 with the pattern layer 425 remained on the epitaxial layer 420. However, the scope of the present invention is not so restricted. In practice, the pattern layer 425 may be removed before the formation of the sacrifice oxide layer 440 to show a structure similar to FIG. 1D after the steps of implanting oxygen ions and removing the sacrifice oxide layer 440.

In the above mentioned embodiments of the present invention, oxygen ions are selectively implanted to the bottoms 150a,250,350,450 of the gate trenches 130,230,330,430 by using the spacers 142,242,342 or the sacrifice oxide 440 layer on the sidewall of the gate trenches 130,230,330,430 as a mask so as to adjust thickness of the oxide layer on the sidewalls and at the bottoms of the gate trenches 130,230,330, 430 respectively for achieving the object of reducing gate-to-drain capacitance. The ion implantation step is carried out to selectively implant oxygen ions into the bottoms 150a,250, 350,450 of the gate trenches 130,230,330,430 without the need of using additional lithographic step. In addition, according to the first and the second embodiments of the present invention, the gate oxide layers 160b,260b and the thicker bottom oxide layers 160a,260a can be formed in one thermal oxidation step. Thus, the fabrication cost of the trenched MOS device with reduced gate-to-drain charge can be effectively reduced.

Moreover, with the shrinkage of gate trench, the problem of oxygen shortage exists when growing thicker oxide layer at the bottoms of the gate trenches 130,230,330,430 by thermal oxidation. The fabrication method of the present invention featuring the step of selectively implanting oxygen ions into the bottoms of the gate trenches 130,230,330,430 is capable of increasing the concentration of oxygen ions at the bottoms of the gate trenches 130,230,330,430 so that the problem of oxygen shortage can be solved.

While the preferred embodiments of the present invention have been set forth for the purpose of disclosure, modifications of the disclosed embodiments of the present invention as well as other embodiments thereof may occur to those skilled in the art. Accordingly, the appended claims are intended to cover all embodiments which do not depart from the spirit and scope of the present invention.

What is claimed is:

1. A fabrication method of a trenched metal-oxide-semiconductor device comprising the steps of:
   providing a semiconductor base;
   forming a plurality of gate trenches in the semiconductor base;
   forming a sacrifice oxide layer over exposed surfaces of the semiconductor base;
   selectively implanting oxygen ions into bottoms of the gate trenches through the sacrifice oxide layer;
   removing the sacrifice oxide layer;
   forming a bottom oxide layer at the bottoms of the gate trenches;
   forming a gate oxide layer lining sidewalls of the gate trenches; and
   forming a plurality of polysilicon gates in the gate trenches respectively.

2. The fabrication method of claim 1, wherein the semiconductor base includes a substrate and an epitaxial layer formed on the substrate.

3. The fabrication method of claim 2, after forming the polysilicon gates in the gate trenches, further comprising the steps of:
   forming a body with a first conductive type in the epitaxial layer; and forming a plurality of source regions with a second conductive type in the body.

4. The fabrication method of claim 1, wherein the semiconductor base includes a substrate, an epitaxial layer with a second conductive type, and a body layer with a first conductive type, the epitaxial layer is formed on the substrate, and the body layer is formed on the epitaxial layer, and after forming the polysilicon gates in the gate trenches, further comprising the step of forming a plurality of source regions with the second conductive type in the body layer.

5. The fabrication method of claim 1, wherein the step of forming the gate trenches in the semiconductor base comprises:
   forming a pattern layer on the semiconductor base to define the gate trenches; and
   etching the semiconductor base through the pattern layer to form the gate trenches in the semiconductor base.

6. The fabrication method of claim 5, further comprising the step of removing the pattern layer before forming the sacrifice oxide layer.

7. The fabrication method of claim 6, wherein an upper surface region of the semiconductor base is implanted with oxygen ions in the step of implanting oxygen ions into the bottoms of the gate trenches.

8. The fabrication method of claim 1, wherein the bottom oxide layer and the gate oxide layer are formed simultaneously.

9. The fabrication method of claim 8, wherein an angle between an implanting direction in the oxygen ion implantation step and the sidewalls of the gate trenches is much smaller than 90 degrees.

* * * * *